(12) United States Patent
Lehnert et al.

(10) Patent No.: US 10,059,899 B2
(45) Date of Patent: Aug. 28, 2018

(54) COMPONENT HAVING A COATING AND METHOD FOR THE PRODUCTION THEREOF

(71) Applicant: MAHLE International GmbH, Stuttgart (DE)

(72) Inventors: Monika Lehnert, Remseck (DE); Kurt Maier, Leonberg (DE)

(73) Assignee: MAHLE International GmbH, Stuttgart (DE)

( * ) Notice: Subject to any disclaimer, the term of this patent is extended or adjusted under 35 U.S.C. 154(b) by 0 days.

(21) Appl. No.: 14/437,942

(22) PCT Filed: Oct. 23, 2013

(86) PCT No.: PCT/DE2013/000625
§ 371 (c)(1),
(2) Date: Apr. 23, 2015

(87) PCT Pub. No.: WO2014/063676
PCT Pub. Date: May 1, 2014

(65) Prior Publication Data
US 2015/0275120 A1   Oct. 1, 2015

(30) Foreign Application Priority Data

Oct. 23, 2012  (DE) .................. 10 2012 020 757

(51) Int. Cl.
*C10M 125/02* (2006.01)
*C23C 14/06* (2006.01)
(Continued)

(52) U.S. Cl.
CPC ........ *C10M 125/02* (2013.01); *C10M 125/20* (2013.01); *C23C 14/06* (2013.01);
(Continued)

(58) Field of Classification Search
CPC combination set(s) only.
See application file for complete search history.

(56) References Cited

U.S. PATENT DOCUMENTS 4,619,865 A   10/1986  Keem et al.
5,449,547 A *  9/1995  Miyazaki ............... C23C 14/06
                                                    106/286.1
(Continued)

FOREIGN PATENT DOCUMENTS

DE   10 2008 042 747 A1   4/2010
DE   10 2008 062 220 A1   6/2010
(Continued)

OTHER PUBLICATIONS

International Search Report of PCT/DE2013/000625, dated Feb. 25, 2014.
(Continued)

*Primary Examiner* — Taiwo Oladapo
(74) *Attorney, Agent, or Firm* — Collard & Roe, P.C.

(57) ABSTRACT

The invention relates to a component having a coating containing chromium, nitrogen and carbon, which component is characterized in that the coating comprises a sliding layer having a ceramic phase and an amorphous phase. According to the invention the ceramic phase forms a crystalline ceramic matrix from $Cr_x(C_{1-y}N_y)$ with $0.8=x=1.2$ and $y>0.7$, and the amorphous phase consists of carbon particles that are embedded in substantially uniform distribution in the crystalline ceramic matrix.

10 Claims, 2 Drawing Sheets

Figure 2:
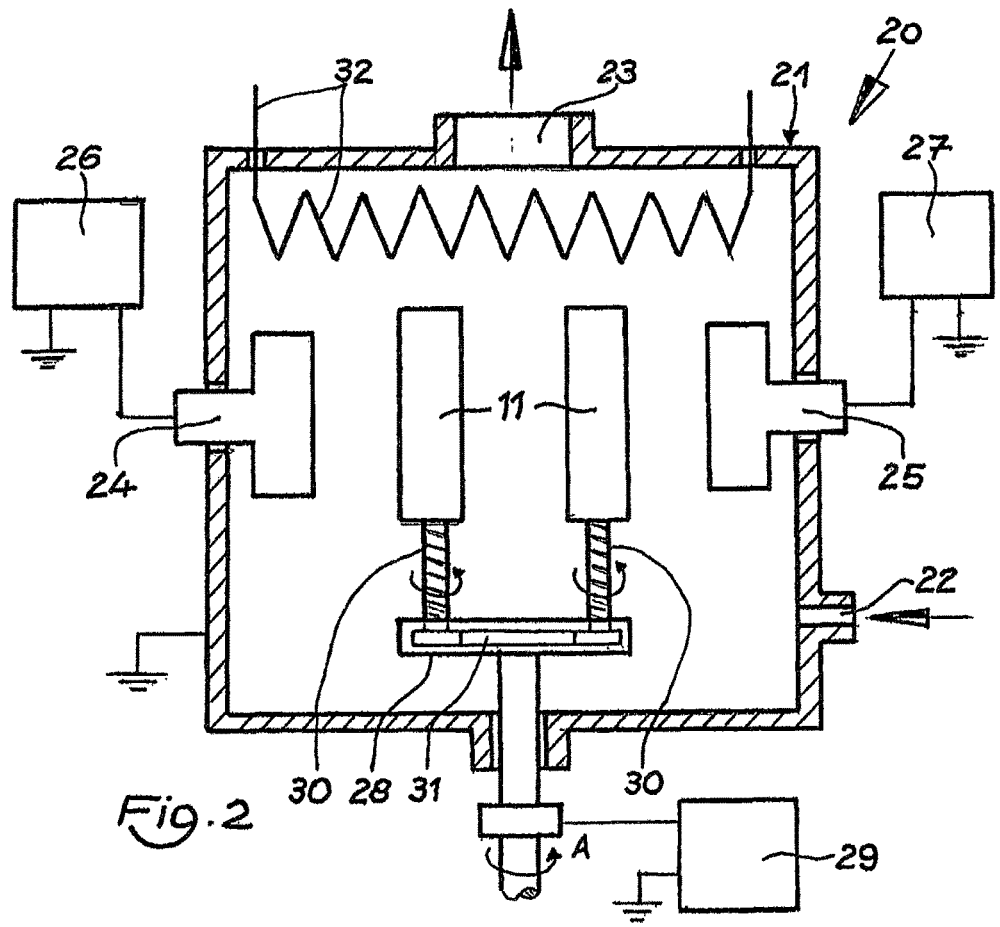

(51) Int. Cl.
  *C23C 14/32* (2006.01)
  *C23C 28/00* (2006.01)
  *C10M 125/20* (2006.01)

(52) U.S. Cl.
  CPC ...... *C23C 14/0635* (2013.01); *C23C 14/0641* (2013.01); *C23C 14/32* (2013.01); *C23C 14/325* (2013.01); *C23C 28/322* (2013.01); *C23C 28/324* (2013.01); *C23C 28/34* (2013.01)

(56) References Cited

U.S. PATENT DOCUMENTS

| | | |
|---|---|---|
| 7,572,344 B2 | 8/2009 | Maier et al. |
| 8,652,620 B2 | 2/2014 | Fischer et al. |
| 2003/0035894 A1 | 2/2003 | Derflinger et al. |
| 2004/0038084 A1 | 2/2004 | Aharonov et al. |
| 2008/0007006 A1* | 1/2008 | Kawai .................. C23C 14/024 277/310 |
| 2011/0052934 A1* | 3/2011 | Sugimoto ........... C23C 14/0605 428/623 |
| 2011/0268946 A1 | 11/2011 | Fischer et al. |
| 2012/0248711 A1* | 10/2012 | Iwashita ............. C23C 14/0605 277/444 |
| 2012/0282461 A1 | 11/2012 | Tsuji |
| 2013/0004756 A1 | 1/2013 | Kennedy et al. |
| 2013/0280480 A1 | 10/2013 | Uihlein et al. |

FOREIGN PATENT DOCUMENTS

| | | |
|---|---|---|
| DE | 10 2010 002 686 A1 | 9/2011 |
| DE | 10 2010 060 152 A1 | 4/2012 |
| EP | 1 136 585 A1 | 9/2001 |
| EP | 1 413 647 A2 | 4/2004 |
| EP | 2 100 807 A1 | 9/2009 |
| JP | 2000-192183 A | 7/2000 |
| JP | 2001-192864 A | 7/2001 |
| JP | 2009-532581 A | 9/2009 |
| JP | 2011-052238 A | 3/2011 |
| JP | 2011-149035 A | 8/2011 |
| JP | 2011-246792 A | 12/2011 |
| WO | 2005/121609 A1 | 12/2005 |
| WO | 2007/115419 A2 | 10/2007 |
| WO | 2011/000068 A1 | 1/2011 |

OTHER PUBLICATIONS

International Search Report of PCT/DE2013/000626, dated Feb. 21, 2014.
German Search Report dated Aug. 20, 2013 in German Application No. 10 2012 020 757.3 with English translation of the relevant parts.
German Search Report dated Aug. 20, 2013 in German Application No. 10 2012 020 756.5 with English translation of the relevant parts.
DIN EN ISO 4287, Geometrical Product Specifications (GPS)—Surface textile: Profile method—Terms, definitions and surface texture parameters (ISO 4287:1997 + Cor 1:1998 + Cor 2:2005 + Amd 1:2009); German version EN ISO 4287:1998 + AC:2008 + A1:2009 and English translation of DIN EN ISO 4287: Jul. 2010.
Second Chinese Office Action in Chinese Application No. 201380061318.4 dated Jan. 16, 2017 with English translation.
Langston et al. Introduction to Gas Turbines for Non-Engineers 1997.

* cited by examiner

COMPONENT HAVING A COATING AND METHOD FOR THE PRODUCTION THEREOF

CROSS REFERENCE TO RELATED APPLICATIONS

This application is the National Stage of PCT/DE2013/000625 filed on Oct. 23, 2013, which claims priority under 35 U.S.C. § 119 of German Application No. 10 2012 020 757.3 filed on Oct. 23, 2012, the disclosures of which are incorporated by reference. The international application under PCT article 21(2) was not published in English.

The present invention relates to a component having a coating containing chromium, nitrogen, and carbon.

Coatings composed of chromium nitride, produced using PVD methods with arc vaporization, are known to a person skilled in the art. They are used, for example, on components for internal combustion engines, particularly for diesel engines. These coatings demonstrate good wear resistance and are thermally stable at the temperatures that prevail at the component during engine operation.

An important goal in the development of internal combustion engines is further reduction of fuel consumption. For this purpose, the friction losses within the internal combustion engine have to be reduced—in addition to a great number of other measures. Among other things, an aim is to reduce the friction between the working surfaces of the piston rings and the cylinder working surface during engine operation.

In DE 10 2008 042 747 A1, a carbon coating of the type a-C:H is disclosed for reducing friction. Because of their content of hydrogen, however, such coatings are stable to at most 300° C. Particularly in diesel engines, the surface temperatures of the uppermost piston rings assigned directly to the combustion chamber are clearly higher. The a-C:H layers decompose at temperatures above 300°, giving off hydrogen. The carbon that remains behind turns into graphite and is rapidly worn away by abrasion. Such coatings can therefore be used only as run-in layers, but not as permanently durable layers.

The addition of carbon to coatings composed of chromium nitride is described in U.S. Pat. No. 5,449,547 A and EP 2 100 807 A1. In both cases, carbon is supposed to be embedded in solid solution. This means that carbon does not form its own phase, but rather is interstitially embedded in the CrN lattice. The addition of carbon is supposed to improve the mechanical properties of the layer, particularly its impact resistance. An improvement in friction is not intended, and is also not possible in this way.

WO 2007/115419 discloses the deposition of a multi-phase layer material by means of a PVD arc method. In this connection, the layer material can consist of chromium carbide and carbon or of chromium carbonitride and carbon, however with a total carbon proportion of more than 20 atom-%. Such layers do demonstrate low friction, but because of their high carbon proportion, they are mechanically relatively unstable and therefore wear rapidly.

A two-phase piston ring coating, consisting of chromium carbide and carbon, is also described in DE 10 2008 062 220 A1. In this connection, the proportion of chromium carbides is supposed to amount to maximally 80 atom-%. The rest is free carbon, which is present in the form of graphite as a separate phase. The easy fissility of graphite also leads to problems with regard to mechanical stability.

The task of the present invention consists in further developing a component of the stated type in such a manner that its coating contributes to reducing friction, without impairing the wear resistance and the ability to withstand thermal stress.

The solution consists in that the coating has a lubricating layer having a ceramic phase and an amorphous phase, that the ceramic phase forms a crystalline ceramic matrix composed of $Cr_x(C_{1-y}N_y)$ with $0.8 \leq x \leq 1.2$ and $y > 0.7$, and that the amorphous phase consists of carbon particles that are embedded into the crystalline ceramic matrix in substantially uniform distribution.

An object of the invention is furthermore a method for coating a component with a lubricating layer having a ceramic phase and an amorphous phase, wherein at least one component is mounted on a spindle disposed on a turntable, so as to rotate, in a vacuum chamber. According to the invention, the lubricating layer is applied by means of a PVD method with arc vaporization, wherein the following parameters are used. At least one metal target and at least one carbon target serve as material sources, wherein the ratio of the target streams of metal to carbon amounts to 7 to 13. The deposition temperature at the component amounts to 350° C. to 450° C. The bias voltage amounts to 0 to −100 V. The pressure in the vacuum chamber amounts to 2-4 Pa. The atmosphere in the vacuum chamber is composed of nitrogen and inert gas having a ratio of the nitrogen partial pressure to the total pressure of 0.55 to 0.75. During the coating process, the rotation of the turntable amounts to 20-40 revolutions per minute, while the rotation of the at least one spindle amounts to 5-7 revolutions per revolution of the turntable.

The ceramic phase in the form of a crystalline ceramic matrix brings about great wear resistance of the coating of the component according to the invention, while the amorphous phase in the form of carbon particles brings about a reduction in friction, thanks to its self-lubricating property.

Both phases are substantially free of hydrogen. This brings about great thermal stability of the coating of the component according to the invention.

Advantageous further developments are evident from the dependent claims.

It preferably holds true for the crystalline ceramic matrix composed of $Cr_x(C_{1-y}N_y)$ that $0.9 \leq x \leq 1.1$ and $y > 0.8$.

The carbon particles preferably have a size of less than 10 nm, particularly preferably of less than 5 nm. The smaller the carbon particles, the more uniformly they are distributed in the matrix, and the better the self-lubricating effect.

The lubricating layer preferably has a total carbon content of 3-15 atom-%, particularly preferably of 5-10 atom-%. An overly high carbon content would lead to the formation of overly large carbon particles or actually to the formation of carbon lamellae. Both effects would reduce the mechanical stability of the lubricating layer of the component according to the invention.

The thickness of the lubricating layer can amount to 1 to 50 μm, preferably 10 to 30 μm. These comparatively large thicknesses can be prepared because the inherent stresses of the lubricating layer of the component according to the invention are relatively low.

The Vickers hardness of the lubricating layer preferably amounts to 2000-3000 HV 0.05 and/or the modulus of elasticity of the lubricating layer amounts to 200-300 GPa, in order to optimize its wear resistance.

The lubricating layer preferably has an average roughness depth Rz of less than 1 μm and/or a material proportion Rmr(02) of more than 50% and/or a material proportion Rmr(03) of more than 80%. Because the ceramic phase is relatively hard, the surface of the lubricating layer should have as few irregularities as possible, which would have an abrasive effect on the counter-body in a tribological system. The definition and the determination of the material proportion Rmr are established in the standard DIN EN ISO 4287.

The basic body of the component can consist of cast iron or steel, for example.

Preferably, an adhesion layer composed of a metallic material is provided between the basic body and the lubricating layer. This layer consists of a metal or a metal alloy, for example molybdenum, chromium, titanium, tungsten or chromium-aluminum alloy. The adhesion layer serves for optimizing the adhesion of the subsequent layers on the basic body.

Preferably, an intermediate layer composed of a metal nitride material, for example chromium nitride, molybdenum nitride, titanium nitride or chromium aluminum nitride, is provided between the adhesion layer and the lubricating layer. The intermediate layer functions as a diffusion barrier. It prevents diffusion of carbon into the adhesion layer. If carbon were to diffuse into the adhesion layer, the formation of brittle metal carbides would occur at the boundary zone of the two layers. This would result in mechanical instability.

The adhesion layer and the intermediate layer each preferably have a thickness of 0.5 to 4 µm. These thicknesses are completely sufficient, so that an overly high end weight of the component according to the invention is avoided.

The component according to the invention is preferably a component for an internal combustion engine, for example a piston ring.

Figure 1:
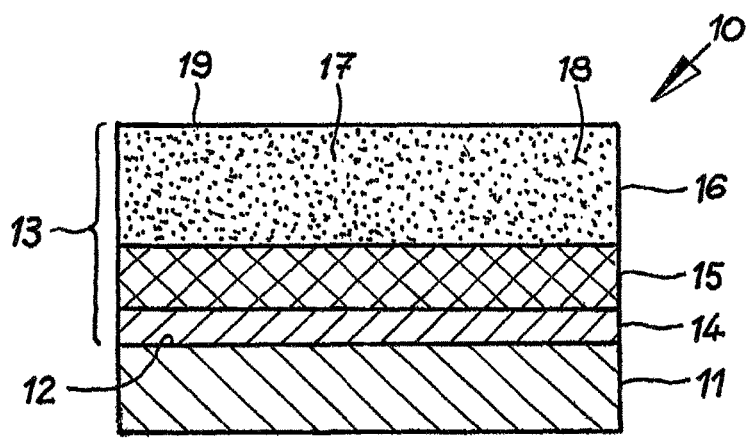
Figure 4:
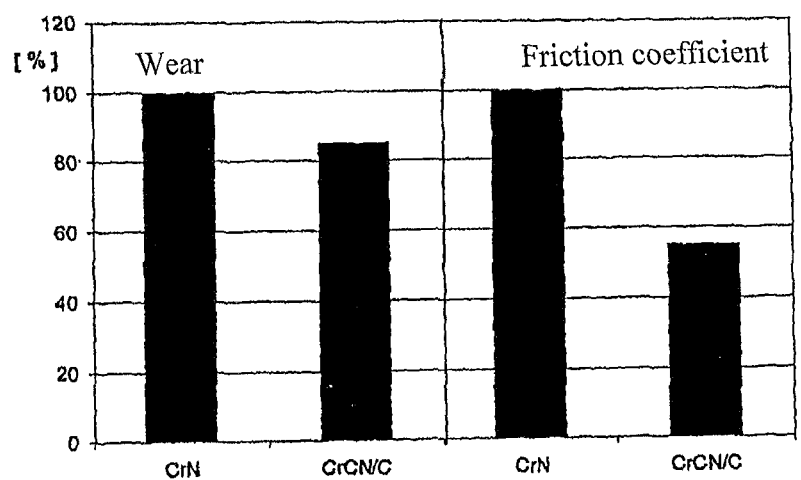
Figure 3:
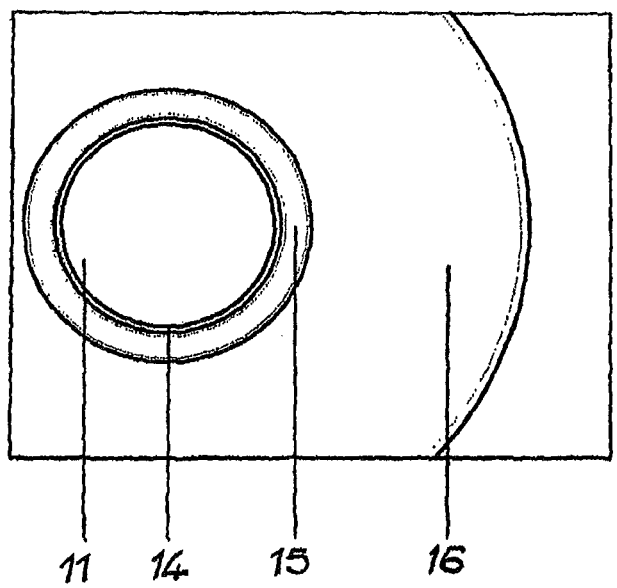

The component according to the invention will be explained in greater detail using the attached drawings. These show, in a schematic representation, not true to scale:

FIG. 1 an exemplary embodiment of a component coated according to the invention, in section;

FIG. 2 an exemplary embodiment of the apparatus for coating the component according to FIG. 1;

FIG. 3 a schematic representation of a dome microsection of the exemplary embodiment according to FIG. 1;

FIG. 4 a bar diagram of a wear test of a component coated according to the invention and of a comparison component.

FIG. 1 shows a schematic representation of an exemplary embodiment of a component 10 coated according to the invention, for example of a piston ring for an internal combustion engine. The component 10 has a basic body 11 having a coated surface 12. In the case of a piston ring, the coated surface 11 is the working surface that stands in contact with the cylinder surface during engine operation, sliding on it. The basic body 11 generally consists of steel or cast iron. The surface 11 can be nitrided in known manner before being coated. To produce the coating 13, in the exemplary embodiment an adhesion layer 14 composed of chromium is applied to the surface 12 in known manner, for example by means of a PVD method. An intermediate layer 15, which consists of chromium nitride in the exemplary embodiment, is applied to the adhesion layer 14. The intermediate layer can also be produced in known manner, by means of a PVD method.

According to the invention, a lubricating layer 16 is applied to the intermediate layer 15. The lubricating layer 16 has a ceramic phase 17 and an amorphous phase 18. The ceramic phase 17 is configured as a crystalline ceramic matrix, into which small particles of the amorphous phase 18 are embedded in homogeneous distribution. The ceramic phase 17 consists of chromium carbonitride $Cr_x(C_{1-y}N_y)$, wherein $0.8 \leq x \leq 1.2$ and $y > 0.7$. The amorphous phase 18 consists of carbon particles. In the case of a piston ring, the surface 19 of the lubricating layer 16 represents the contact surface during engine operation, with which the piston ring stands in contact with the cylinder working surface, sliding on it, and forms a tribological system with it.

To produce the coating 13, particularly the lubricating layer 16, a PVD method with arc vaporization is used. FIG. 2 schematically shows a coating system 20, as it can be used to carry out this method. The structure of this coating system will be described below.

The coating system 20 according to FIG. 2 has a vacuum chamber 21, which has a gas inlet opening 22 and an exhaust opening 23. An electrical heating device 32 is affixed to the walls of the vacuum chamber 21. The vacuum chamber 21 itself lies electrically at ground.

Two targets 24, 25 are disposed in the vacuum chamber 21. The first target 24 consists of metallic chromium and is connected with the cathode of a current source 26 to produce an arc. The second target 25 consists of carbon in the form of graphite and is also connected with the cathode of a current source 27 to produce an arc. The targets 24, 25 are disposed in such a manner that they are at an equal distance from the surface 12 to be coated of the basic body 11 of the component to be coated. If the vacuum chamber 21 is correspondingly large, a group of targets can be provided in place of an individual target 24, 25, in each instance, wherein the spatial arrangement must be configured in such a manner that the ion flow proceeding from the targets is spatially homogeneous, to a great extent.

A turntable 28 that can rotate about the arrow A is disposed in the center of the vacuum chamber 21 and is electrically connected with a current source 29 for producing the bias voltage. The turntable 28 has multiple spindles 30, disposed in circular shape around its center point. The basic bodies 11 to be coated are fastened onto the spindles 30. The spindles 30 are mounted so as to rotate and are driven by the turntable 28 by way of a planetary gear mechanism 31 provided in its interior. The translation ratio of the planetary gear mechanism amounts to 5 to 7.

In the following, the principle of a PVD coating method using arc vaporization will be described.

After the basic bodies 11 to be coated are mounted on the spindles 30, the vacuum chamber 21 is closed and the pressure in the vacuum chamber 21 is reduced to 0.03 Pa or less, in that gas is pumped out through the exhaust opening 23. At the same time, the heating device 32 is put into operation. The heating device 32 brings about degassing, i.e. the release of gases that are absorbed on the inner wall of the vacuum chamber 21 and on the basic bodies 11 to be coated. After pumping out and heating have taken place, the turntable 28 is put into rotation and a noble gas, generally argon, is introduced into the vacuum chamber through the gas inlet opening 22. Now the targets 24 composed of chromium are put into operation. A negative bias voltage of −800 to −1200 volts is applied by way of the current source. The chromium ions emitted by the targets 24 in turn ionize the argon gas. By means of the high bias voltage, the ions are accelerated greatly, impact the basic bodies 11 at a high kinetic energy, and strike the uppermost atom layers, which typically consist of oxides, out of the surface of the basic bodies 11. In this way, cleaning of the surfaces 12 to be coated of the basic bodies 11 is carried out by means of ion bombardment. This process is also referred to as ion etching.

Afterward, the bias voltage is set to a low value, the argon pressure is increased slightly, and the current feed to the targets 24 composed of chromium is increased. Under these conditions, more chromium ions are deposited onto the cleaned surface 12 of the basic body 11 than are etched off by means of the ion bombardment. These remaining chromium ions form a metallic chromium layer as an adhesion layer 14.

After some time, at a constant current feed to the targets 24 composed of chromium and at a continuing low bias voltage, the argon is replaced with nitrogen. Nitrogen represents a reactive gas. Within the plasma that is burning in the chamber, the N—N bond of the nitrogen molecules is broken up. The free nitrogen atoms react with the chromium ions. The reaction product is deposited on the surface of the adhesion layer 14 as an intermediate layer 15 in the form of chromium nitride.

To ensure good adhesion of the lubricating layer to be formed on the intermediate layer 15 composed of chromium nitride, in the next step intermediate etching by means of ion bombardment is carried out under the conditions described above.

Afterward, the lubricating layer 16 is deposited. For this purpose, nitrogen and argon are introduced into the vacuum chamber 21 and both the targets 24 composed of chromium and the targets 25 composed of carbon are put into operation. The bias voltage remains at a low value.

The turntable 28 is put into fast rotation of 20-40 revolutions per minute. This is necessary so that the free carbon, which is not bound as chromium carbonitride in the ceramic phase 17, is deposited in the form of discrete particles homogeneously distributed in the ceramic phase 17. At a slow rotation of the turntable 28, a layer system in the form of a multi-lamellae package is formed, which consists of a sequence of ceramic lamellae and lamellae composed of carbon. Because lamellae composed of carbon form only weak bonding forces, such a lamellae package becomes relatively unstable mechanically.

The ratio of the cathode current for the targets 24 composed of chromium to the cathode current for the targets 25 composed of carbon is decisive for adjusting the total carbon content according to the invention. This ratio amounts to 7 to 13, preferably 8.5 to 11.5.

The composition of the ceramic phase 17 is substantially controlled by means of the nitrogen partial pressure. A high nitrogen partial pressure leads to a high nitrogen content in the ceramic phase 17. The ratio of nitrogen partial pressure to total pressure should amount to 0.55 to 0.75, preferably 0.6 to 0.7.

It is also possible to carry out the deposition of the lubricating layer 16 with neon in place of argon. Neon has a lower atomic mass than argon. This has an effect on the effect known as "resputtering." "Resputtering" means that the layer to be deposited is constantly bombarded by inert gas ions during its formation, which ions wear away part of the layer particles, particularly particles that are bound in less strongly. The sputter rate now depends on the mass of the inert gas ions. The light neon ions have a high sputter rate with regard to carbon and a lower sputter rate with regard to chromium or chromium carbonitride, while the conditions are the opposite for the heavier argon ions. With neon as the inert gas, resputtering of carbon can therefore be increased in comparison with resputtering of chromium or chromium carbonitride, and thus the amount proportion of the embedded carbon particles can be reduced. Furthermore, embedded neon leads to lower inherent stresses than embedded argon.

The lubricating layer 16 has moderate internal stresses under suitable deposition conditions and can therefore be deposited in layers having a thickness of up to 50 μm.

When the desired layer thickness has been reached, the electrical currents, the heating, as well as the gas feed are turned off, and the vacuum chamber 21 including its contents are allowed to cool off. Afterward, the vacuum chamber 21 can be opened and the coated components 10 can be removed.

As is usual for PVD coating by means of arc vaporization, the surface of the lubricating layer 16 has a relatively high roughness in the deposited state, which is unsuitable for tribological uses. For this reason, a final finishing process is undertaken. This process can take place, depending on the geometry of the components 10, by means of grinding, honing, lapping or a combination of these methods. It is essential to produce a smooth surface having a high contact ratio.

In the following, an exemplary embodiment of the present invention will be described.

Piston rings composed of nitrided steel and having a trapezoid cross-section are used. Such piston rings and their production are known, for example from WO 2005/121609 A1. Before being coated, the piston rings are carefully cleaned, using an aqueous method, and dried. Afterward, they are arranged in cylindrical stacks, fixed in place using an auxiliary apparatus, and set onto the corresponding places of the turntable 28 as spindles 30.

The turntable 28 is moved into the vacuum chamber 21 and the latter is then closed. Afterward, the vacuum chamber 21 is evacuated to a final pressure of 0.03 Pa and heated to a temperature of 420° C. This takes 90 to 120 minutes. If the heating temperature is too low, degassing is incomplete. If the heating temperature is too high, the piston rings can be deformed.

This temperature is maintained during the entire sequence of the process.

The first ion etching takes place at a bias voltage of −900 volts and an argon pressure of 0.08 Pa. The targets 24 composed of chromium are intermittently operated over a total time of 12 minutes, namely for 30 seconds at a total current of 90 A, followed by a pause of 30 seconds. The relatively low cathode current and the pauses serve to prevent overly strong heating of the piston rings. This would lead not only to deformation of the piston rings but also to denitration of the edge zone close to the surface, which would reduce the adhesion of the subsequent adhesion layer 14 composed of chromium. An overly high bias voltage would also heat the piston rings too strongly. Vice versa, an overly low bias voltage would not bring about a satisfactory cleaning result.

The adhesion layer 14 composed of chromium is then deposited under argon pressure of 2 Pa, bias voltage of −50 volts, and a cathode current of 480 A. An adhesion layer 14 having a thickness of approximately 1.5 μm is formed within 60 minutes. Under the same conditions, only under nitrogen pressure of 2 Pa in place of the argon, the intermediate layer 15 composed of chromium nitride is subsequently formed. An intermediate layer 15 having a thickness of approximately 3 μm is formed within 90 minutes. This intermediate layer 15 functions as a diffusion barrier, among other things. If the lubricating layer 16 were to be deposited directly onto the metallic adhesion layer 14 composed of chromium, then carbon would diffuse into the chromium layer. Chromium carbides would form in the boundary zone, and these would lead to adhesion problems. The intermediate layer 15 composed of chromium nitride prevents such diffusion and allows good adhesion, able to withstand mechanical stress, of the lubricating layer 16 applied to it.

A further improvement in adhesion is achieved if deposition of the intermediate layer 15 composed of chromium nitride is followed by renewed ion etching, which is carried out under the same conditions as described above. By means of this ion etching, chromium nitride particles that lie only loosely on the surface and therefore can impair adhesion are removed.

To deposit the lubricating layer 16, not only the targets 24 composed of chromium but also the targets 25 composed of carbon are put into operation. The following conditions are adjusted:
Total cathode current for the chromium targets: 800 A
Total cathode current for the carbon targets: 80 A
Bias voltage: −50 V
Total pressure: 3 Pa
Ratio of the partial pressures of nitrogen and argon: 2 to 1
Speed of rotation of the turntable: 30 rpm In 7 hours, a lubricating layer having a thickness of approximately 18 μm is deposited.

To check the layer thicknesses, a dome microsection was produced, the schematic representation of which is reproduced in FIG. 3. It shows, from the inside to the outside, the basic body 11 composed of steel, the adhesion layer 14 composed of chromium, the intermediate layer 15 composed of chromium nitride, and the lubricating layer 16 according to the invention. The adhesion layer 14 composed of chromium has a thickness of 1.3 μm, the intermediate layer 15 composed of chromium nitride has a thickness of 3.2 μm, and the lubricating layer 16 according to the invention has a thickness of 16 to 18 μm. The dome microsection shows smooth transitions without fraying between the individual layers. This documents perfect adhesion of the individual layers to one another.

The measurement of the Vickers hardness HV 0.05 of the lubricating layer 16 according to the invention was carried out in known manner and yielded a value of 2400 HV 0.05. The modulus of elasticity of the lubricating layer 16 according to the invention was determined by means of the known load penetration method. This yielded a value of 280 GPa.

The composition of the lubricating layer 16 according to the invention 16 was analyzed in known manner, using glow lamp emission spectrometry. In this connection, the following values were determined: chromium content 47 atom-%, nitrogen content 47 atom-%, total carbon content 6 atom-%.

Final machining of the piston rings takes place with a combination of fine-grinding and lapping. For fine-grinding, a corundum grinding paper having a grain size of 500 is used. This is followed by lapping using diamond paste having a grain size of 0.5 μm.

Evaluation of the surface characteristic values according to DIN EN 4287 yielded an averaged roughness depth Rz of 0.09, a value for the material proportion Rmr 02 of 57%, and a value for the material proportion Rmr 03 of 85%.

After fine-grinding and lapping, what is called a scratch test was conducted to check the layer adhesion. In this connection, the lubricating layer 16 is scratched with a diamond tip, which is passed in a straight track over a length of 4 mm over the surface of the lubricating layer 16. During this test, the load increases from zero to 180 N, so that the diamond tip penetrates deeper and deeper into the lubricating layer 16. At a certain load, the lubricating layer 16 cannot be deformed any further and chips off. This load is called the critical load. The higher the critical load, the higher the adhesion or deformability of the lubricating layer 16. The experiments showed that the lubricating layer 16 starts to chip off at a critical load of approximately 117 N. This is a very good value for such a lubricating layer.

The layer structure was investigated by means of high-resolution transmission electron spectroscopy. In the bright-field image, the lubricating layer 16 did not show a lamellar layer structure but rather a homogeneous morphology.

A dark-field image of carbon in the same region of the lubricating layer 16 showed carbon particles having a size of less than 10 nm. These are distributed, as the amorphous phase 18, with uniform distribution, to a great extent, in the ceramic phase 17 that is configured as a crystalline ceramic matrix (see FIG. 2).

For a comparison test, a piston ring having a conventional chromium nitride layer is used as a comparison example; this ring is produced in a manner similar to that of the exemplary embodiment. Piston rings composed of nitrided steel are cleaned as described above, placed into the vacuum chamber 21, etched, and provided with an adhesion layer composed of chromium. The chromium nitride layer is deposited under the same conditions as for the exemplary embodiment. Only the coating time is increased to 10 hours. In this connection, a chromium nitride layer having a thickness of 20 μm and a Vickers hardness of approximately 1200 HV 0.05 is formed. This layer is finish-machined in analogous manner as described above, by means of fine-grinding and lapping.

To measure the wear resistance of the piston rings according to the exemplary embodiment and according to the comparison example, a known tribometer was used, which produced reversible sliding wear. Segments of a piston ring coated according to the invention, having lubricating layers according to FIG. 1, and segments of a piston ring coated according to the comparison example were used as test parts. Segments of a corresponding honed cylinder composed of lamellar cast iron were used as counter-bodies. With this test setup, the movement of the piston rings in the cylinder was reproduced, specifically in the wear-relevant region of the upper reversal point. Accordingly, the test conditions were selected in such a manner that during slower movement and the lowest supply of lubrication oil, a high load and therefore a high surface pressure acted on the test setup, in accordance with the gas pressure to which the piston ring is subject during engine operation. The test conditions were, in detail:
Test duration: 12 hours
Load 1,200 N
Surface pressure: 57 N/mm$^2$
Stroke: 4 mm
Speed: 1.33 m/min
Frequency: 5 Hz
Lubrication: 0.036 g every 2 hours
Oil: motor oil 5 W 40
Temperature: 20° C.

During the wear test, the friction forces that occurred were measured and the friction coefficients were calculated from them. After the test, the wear depth on the piston rings and the counter-bodies was evaluated. These were very low, in part, so that a white-light interferometer was used to determine the profile depth.

In the evaluation of the measurement results, the pairing of chromium nitride—lamellar cast iron serves as a comparison example according to the state of the art, and as a reference for standardization of the data. The resulting FIG. 4 shows the comparison of the values for wear and friction as a bar diagram. From this, it can be seen that the lubricating layer 16 according to the invention demonstrates somewhat improved wear resistance and a clearly reduced friction coefficient as compared with a conventional chromium nitride layer.

The thermal resistance of the lubricating layer 16 according to the invention was checked in that piston rings provided with a lubricating layer according to the invention were aged in air at a temperature of 500° C. over 6 hours. Afterward, the aged lubricating layer was examined in comparison with a non-aged lubricating layer. Two methods were used for this purpose. For one thing, a dome microsection was produced, in each instance, and subsequently the appearance of the lubricating layer was examined under a microscope. For another thing, the lubricating layers were examined by means of X-ray diffractometry.

There were no differences in the layer morphology in the dome microsection.

X-ray diffractometry also did not show any differences in the diffraction reflections. In this way, it is shown that no conversions or solid-body reactions tool place during thermal aging. The lubricating layer according to the invention is thermally stable at a temperature of 500° C.

The invention claimed is:

1. Component having a coating containing chromium, nitrogen, and carbon, wherein the coating has a lubricating layer having a ceramic phase and an amorphous phase, that the ceramic phase forms a crystalline ceramic matrix composed of $Cr_x(C_{1-y}N_y)$ with $0.8 \leq x \leq 1.2$ and $y>0.7$, and that the amorphous phase consists of carbon particles that are embedded into the crystalline ceramic matrix in substantially uniform distribution, wherein the lubricating layer has a total carbon content of 3-15 atom-%, and wherein the lubricating layer has an average roughness depth Rz of less than 1 μm and/or the material proportion Rmr(02) amounts to more than 50% and/or the material proportion Rmr(03) amounts to more than 80%, wherein an adhesion layer consisting of molybdenum, chromium, titanium, tungsten or chromium-aluminum alloy is applied between the basic body and the lubricating layer, and wherein an intermediate layer consisting of chromium nitride, molybdenum nitride, titanium nitride or chromium aluminum nitride is applied between the adhesion layer and the lubricating layer.

2. Component according to claim 1, wherein the crystalline ceramic matrix composed of $Cr_x(C_{1-y}N_y)$ meets the conditions $0.9 \leq x \leq 1.1$ and $y>0.8$.

3. Component according to claim 1, wherein the carbon particles have a size of less than 10 nm.

4. Component according to claim 3, wherein the carbon particles have a size of less than 5 nm.

5. Component according to claim 1, wherein the lubricating layer has a total carbon content of 5-10 atom-%.

6. Component according to claim 1, wherein the thickness of the lubricating layer amounts to 1-50 μm.

7. Component according to claim 1, wherein the Vickers hardness of the lubricating layer amounts to 2000-3000 HV 0.05.

8. Component according to claim 1, wherein the modulus of elasticity of the lubricating layer amounts to 200-300 GPa.

9. Component according to claim 1, wherein the component has a basic body composed of cast iron or steel.

10. Component according to claim 1, wherein the component is a piston ring for an internal combustion engine.

* * * * *